(12) United States Patent
Tang

(10) Patent No.: US 6,937,685 B2
(45) Date of Patent: Aug. 30, 2005

(54) APPARATUS AND METHOD FOR COUNTING HIGH-SPEED EARLY/LATE PULSES FROM A HIGH SPEED PHASE DETECTOR USING A PULSE ACCUMULATOR

(75) Inventor: Benjamim Tang, Hawthorne, CA (US)

(73) Assignee: Primarion, Inc., Phoenix, AZ (US)

( * ) Notice: Subject to any disclaimer, the term of this patent is extended or adjusted under 35 U.S.C. 154(b) by 316 days.

(21) Appl. No.: 10/008,272

(22) Filed: Nov. 13, 2001

(65) Prior Publication Data

US 2002/0057118 A1 May 16, 2002

Related U.S. Application Data

(60) Provisional application No. 60/248,043, filed on Nov. 13, 2000.

(51) Int. Cl.⁷ .................................................. H03D 3/24
(52) U.S. Cl. ...................................................... 375/376
(58) Field of Search ................................ 375/373–376, 375/354, 371

(56) References Cited

U.S. PATENT DOCUMENTS

| 5,463,351 | A | * | 10/1995 | Marko et al. ................ 331/1 A |
| 5,757,297 | A | | 5/1998 | Ferraiolo et al. |
| 5,923,704 | A | | 7/1999 | Schnizlein |
| 6,038,254 | A | | 3/2000 | Ferraiolo et al. |
| 6,087,868 | A | | 7/2000 | Millar |
| 6,167,526 | A | * | 12/2000 | Carlson ....................... 713/400 |
| 6,337,590 | B1 | * | 1/2002 | Millar ......................... 327/158 |

* cited by examiner

*Primary Examiner*—Kevin Burd
(74) *Attorney, Agent, or Firm*—T. E. Galanthay

(57) ABSTRACT

The method and device according to the present invention provides a control system, method and apparatus for synchronizing a reference signal to high frequency data signals. Pulses are accumulated before reaching the integrator. Pulse accumulation is provided in a DLL clock and data recovery circuit. Pulses are accumulated using a ripple divider for rising transitions only. In another exemplary embodiment, pulses are accumulated using a ripple divider for both rising and falling transitions.

8 Claims, 13 Drawing Sheets

APPARATUS AND METHOD FOR COUNTING HIGH-SPEED EARLY/LATE PULSES FROM A HIGH SPEED PHASE DETECTOR USING A PULSE ACCUMULATOR

CROSS REFERENCE TO RELATED APPLICATION

This application claims the benefit of, and priority to, U.S. Provisional Application Ser. No. 60/248,043 filed Nov. 13, 2000.

TECHNICAL FIELD

The present invention generally relates to delay locked loop ("DLL") and phase locked loop ("PLL") devices. More particularly, the present invention relates to a digital clock and data recovery method and device for counting pulses from a high speed phase detector using a pulse accumulator in a DLL or a PLL.

BACKGROUND OF THE INVENTION

A PLL is an electronic circuit that controls an oscillator so that the oscillator maintains a constant phase angle relative to a reference signal. Clock recovery circuits typically use a phase-locked loop circuit to track and reduce the phase offset between clock and data signals. The basic architecture of a simple PLL circuit is illustrated in FIG. 1. PLL circuits are used in applications such as generating a clean periodic signal from a noisy signal, frequency multiplication, and clock and data recovery.

A typical voltage-controlled oscillator or ("VCO") 100 may be used to generate an output 102 which is a periodic signal at a desired frequency. The phase locked loop is designed to allow the VCO output 102 to be phase locked to an external reference signal 104. The external reference signal 104 may, for example, be a periodic signal such as a sinusoidal or square wave at a fixed frequency (e.g., for frequency synthesizers and multipliers applications), a modulated waveform (e.g., for a demodulator application), or a non-periodic waveform with timing information such as a data waveform (e.g., for clock and data recovery applications). The phase of the VCO output 102 and the reference signal are compared by phase detector 106, which generates an output signal 108 which indicates whether VCO output signal 102 is earlier or later than the reference signal. Phase detector output 108 is filtered by a loop filter, typically an integrator 110, which generates a control voltage 112 that adjusts the VCO output and aligns the VCO output to the reference frequency and phase.

The implementation of integrator 110 may use a low-pass filter or may, in the alternative, use digital methods to integrate the output of phase detector 106. Digital integrators are often desirable because such integrators offer design flexibility compared to analog integrators. However, such digital integrators are often more complex than analog integrators and, at relatively high frequencies, the digital integrators consume more power than analog integrators.

The basic architecture of a delay locked loop is illustrated in FIG. 2. A DLL is typically a digital device similar to a PLL, however, a DLL uses a variable delay or phase shifter element instead of a voltage controlled oscillator. A periodic input signal 200 is provided to the delay locked loop. The signal is delayed by a variable delay or phase shifter 202, generating an output signal 204 which is a delayed version of the input signal. The DLL output signal 204 can be delay locked to the reference input 206 if the periodic input 200 is relatively close in frequency to the reference input 206 and if the variable delay 202 can be varied in such a way as to ensure that the phase of the output 204 tracks the phase of the reference input 206.

The delay locked loop circuit provides the phase tracking mechanism by using a phase detector 208 that compares the relative phase of the output 204 and the reference 206, and by generating an output 210 that is proportional to the difference in phase. The phase difference is integrated by an integrator 212, generating a control voltage 214 to adjust the delay in variable delay device 202, essentially trying to zero out the difference in phase between output 204 and reference 206. The external reference signal 206 may be a periodic signal such as a sinusoidal or square wave at a fixed frequency (e.g., for clock synthesizers and multipliers applications), or a non-periodic waveform with timing information such as a data waveform (e.g., for clock and data recovery applications).

FIG. 3 illustrates, schematically, a prior art early/late transition based phase detector 300 used in PLL or DLL based clock and data recovery. Phase detector 300 may be substituted for phase detector 208 of FIG. 2 to form a delay locked loop circuit suitable for reducing phase offset between clock and data signals. Phase detector 300 contains a first flip-flop 311, second flip-flop 312, third flip-flop 313, and fourth flip-flop 314. Phase detector 300 receives a data wave form at input 301, and a clock input 320 from the VCO 100 or variable delay 202. The outputs of phase detector 300 are late output 303, early output 305, and data output 302. The flip-flops of device 300 are illustrated as being D flip-flops, with flip-flop 312, 313, and 314 being positive edge-triggered and flip-flop 311 being negative edge-triggered. It is known in the art that the output of a D flip-flop latches the input at the time of the triggering. Phase detector 300 is configured to provide a late output signal 303 for every clock cycle in which the reference signal lags behind the data signal, and to provide an early output signal 305 for every clock cycle in which the reference signal leads the data signal.

Phase detector 300 is incorporated into a DLL loop filter such as that shown in FIG. 4. VCO 400 provides phase selector 402 with a multi-phase periodic inputs that are close to but not necessarily equal to the desired clock frequency for the clock signal 422. For example, the frequency may be obtained through either digital control of the VCO tuning voltage or by placing the VCO in a PLL with an appropriate reference input. Phase detector 401 receives an input data signal 421, and a clock signal 422 from phase selector 402. Phase detector 401 compares the clock "feedback" signal 422 and the data signal 421 and generates early signal 403 and late signal 405 which are provided to integrator 412. Integrator 412 integrates (i.e., counts) the number of early and late pulses. The average early and late information changes relatively slowly, and may be sub-sampled by sub sampler 415 at, for example, one tenth the clock rate of the integration. The output of sub sampler 415 is a digital control word which is provided to phase select device 402 for selection of a phase from VCO 400.

That being said, difficulties and drawbacks exist due to the high frequency operation of the integrator. In order to process high frequency input data, digital integrators are configured to count early and late pulses at high frequencies. High frequency integrator operation typically results in high power consumption, heat dissipation problems, and the design of complex, and accordingly expensive, integrators that are able to perform high frequency integration. Thus, due to the need for ever increasing communication bandwidth, there is a need for a more efficient method and apparatus for implementation of digital integrators for high frequency phase locked loop and delay locked loop circuits.

SUMMARY OF THE INVENTION

The method and device according to the present invention addresses many of the shortcomings of the prior art. In accordance with one aspect of the present invention, a control system, method and apparatus are provided for synchronizing a reference signal to high frequency data signals. In accordance with another aspect of the present invention, pulses are accumulated before reaching the integrator. In an exemplary embodiment, pulse accumulation is provided in a DLL clock and data recovery circuit. In a further exemplary embodiment, pulses are accumulated using a ripple divider for rising transitions only. In another exemplary embodiment, pulses are accumulated using a ripple divider for both rising and falling transitions.

BRIEF DESCRIPTION OF THE DRAWINGS

The present invention is illustrated by way of example and not limitation in the accompanying figures, in which like reference numbers indicate similar elements, and in which.

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, such as buffers, voltage and current references, logic devices, memory components and the like, comprised of various electrical devices, e.g. (resistors, transistors, capacitors, diodes or other devices), whose values may be suitably configured for various intended purposes. In addition, the present invention may be practiced in any microcontroller-based application, data communication application or similar signal processing applications. Such general applications that may be appreciated by those skilled in the art in light of the present disclosure are not described in detail herein. However for purposes of illustration only, exemplary embodiments of the present invention are described herein in connection with the clock and data recovery operation of a micro-controller device.

Further, it should be noted that while various components may be suitably coupled or connected to other components within exemplary circuits, such connections and couplings can be realized by direct connection between components, or by connection through other components and devices located there between. To understand the various embodiments of the present invention, an exemplary description is provided. However, it should be understood that the following examples are for illustration purposes only and that the present invention is not limited to the embodiments disclosed.

That being said, in accordance with one aspect of the present invention, a control system, method and apparatus are provided for synchronizing a reference signal to high frequency data signals. The reference signal synchronization is accomplished without the high frequency integration problems described above by scaling or dividing the early and late pulse signals. In accordance with another aspect of the present invention, pulses are accumulated before reaching the integrator. The scaling of the early and late pulse signals occurs, for example, in a pulse accumulator configured to scale the early and late pulse signals before they reach the integrator. Thus, in a divide by 16 pulse accumulator, for example, the integrator is configured to integrate at a frequency 16 times lower than the configuration used without the pulse accumulator. In this manner, the power draw is reduced and heat dissipation problems discussed above are diminished.

Figure 1:
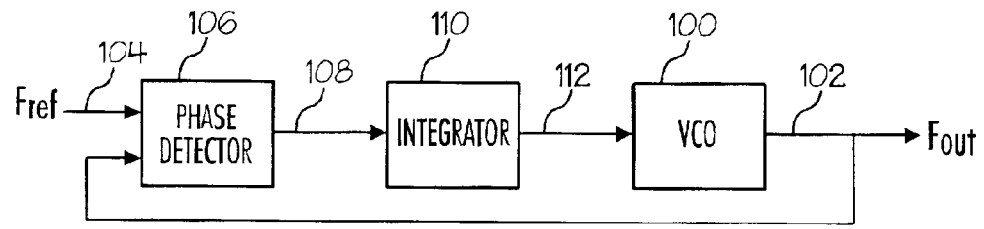
FIG. 1 is a block diagram of a basic prior art phase locked loop.
Figure 2:
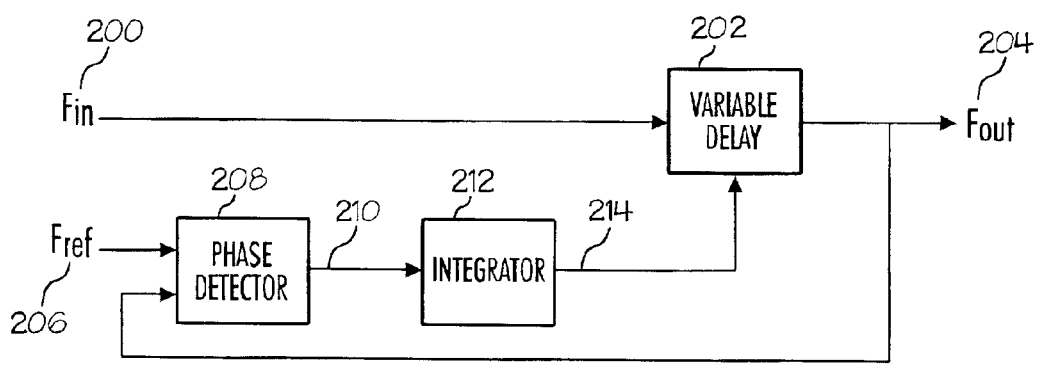
FIG. 2 is a block diagram of a basic prior art delay locked loop.
Figure 3:
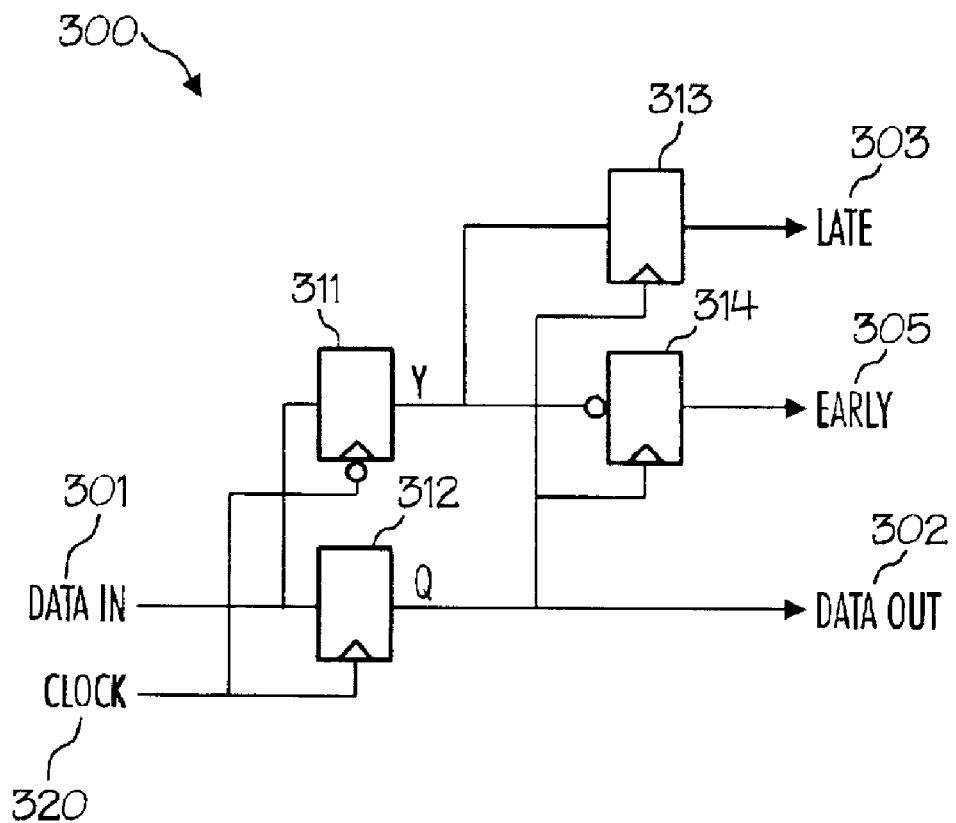
FIG. 3 is a block diagram of a prior art phase detector.
Figure 4:
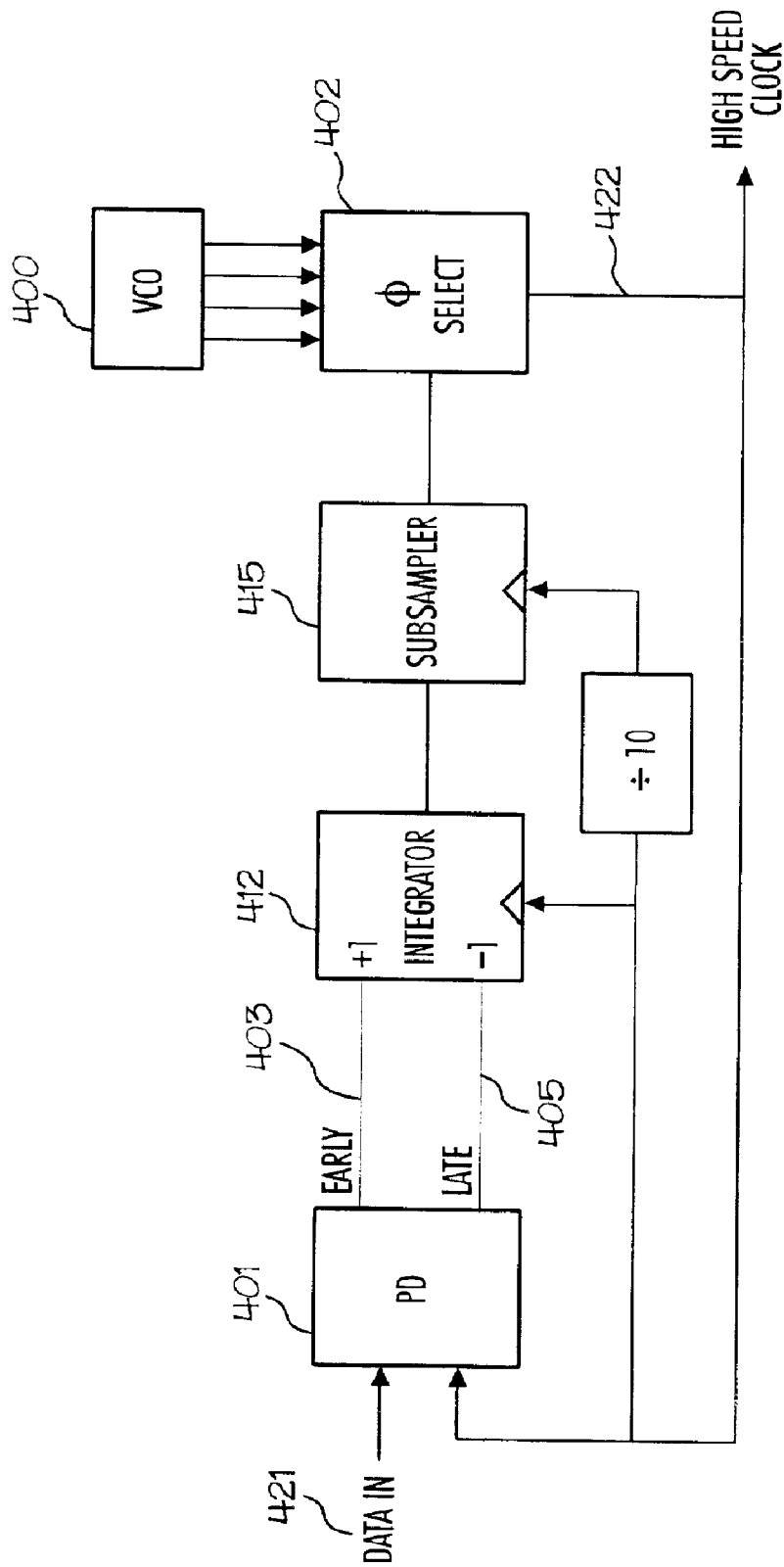
FIG. 4 is a block diagram of a prior art DLL based clock and data recovery with a digital integrator loop filter.
Figure 5:
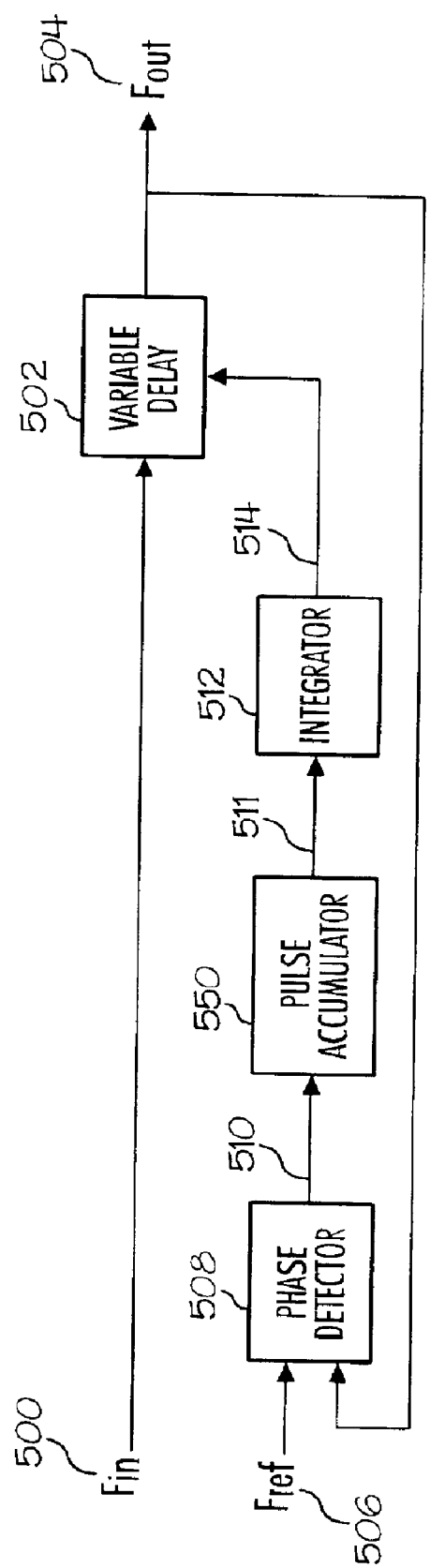
FIG. 5 is a block diagram of an exemplary DLL circuit in accordance with an exemplary embodiment of the present invention.

In an exemplary embodiment, and with reference to FIG. 5, the basic architecture of a delay locked loop incorporating pre-integrator pulse accumulation is illustrated. In accordance with one exemplary embodiment, a pulse accumulator 550 is provided in communication with a phase detector 508 and an integrator 512. Integrator 512 communicates with variable delay device 502 which also receives a data signal 500. Output 504 from variable delay device 502 is received along with a reference signal 506 at phase detector 508.

During operation of the delay locked loop, a periodic input signal 500 is provided to the delay locked loop. The signal is delayed by a variable delay or phase shifter 502, generating an output signal 504 which is a delayed version of the input signal. The DLL output signal 504 can be phase locked to the reference input signal 506 if the reference input 506 is relatively close in frequency to periodic input 500, for example, within 100 parts per million (PPM) or 0.01% (i.e., the frequency of signal 504 may differ from the frequency of signal 500 by less than 100 PPM when signal 504 is phase locked to signal 506).

Furthermore, variable delay device 502 may both vary the frequency and shift the phase of data input signal 500. The frequency is varied by smoothly advancing the phase such that, over a period of time, an entire cycle is swallowed or created. The phase is shifted by selecting a signal with the appropriate phase angle. The phase is shifted such that output signal 504 tracks the phase of the reference input 506. Note that reference input 506 may be a periodic signal such as a sinusoidal or square wave at a fixed frequency (e.g., for clock synthesizers and multipliers applications), or a non-periodic waveform with timing information such as a data waveform (e.g., for clock and data recovery applications).

The DLL provides the phase tracking mechanism by using a phase detector 508. Phase detector 508 compares the relative phase difference of output signal 504 and reference signal 506 and generates a phase detector output signal 510 in the form of early and late signals representing the leading or lagging phase difference between the reference signal 506 and output signal 504. The early and late signals are accumulated in pulse accumulator 550 which is configured to provide a pulse accumulator output signal 511 to integrator 512 indicating the phase difference between the reference signal 506 and output signal 504. The phase difference is integrated by an integrator 512, generating a control voltage 514 to adjust the delay in variable delay device 502, essentially trying to zero out the difference in phase between output 504 and reference 506.

Specifically, pulse accumulator 550 is configured to generate a signal representing a scaled down count of the accumulated early and late pulses. Pulse accumulator 550 is further configured such that data is not lost due to sub-sampling, but that the frequency of the early and late signals passed to the integrator is reduced from the frequency of the early and late signals received at the pulse accumulator from the phase detector. Although the pulse accumulator is shown here in conjunction with a DLL device, the pulse accumulator is also suitable for use in other digital applications, including a digital version of a PLL device.

Figure 6:
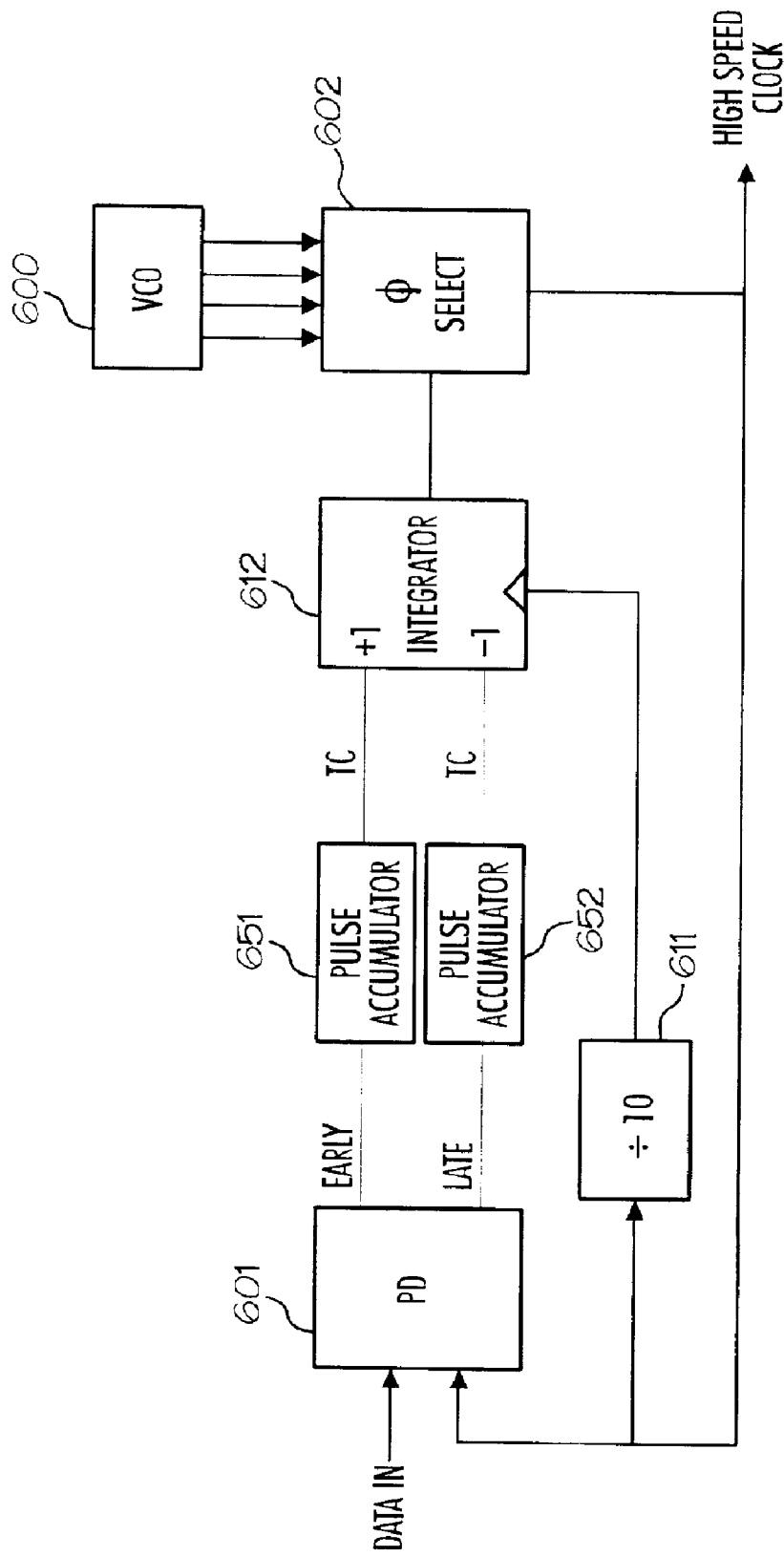
FIG. 6 is a block diagram of an exemplary DLL based clock and data recovery circuit in accordance with an exemplary embodiment of the present invention.

In a further exemplary embodiment, and with reference to FIG. 6, an exemplary loop filter is provided with pulse accumulators 651 and 652. In accordance with one exemplary embodiment, a pulse accumulator 651 is configured to accumulate early pulses from phase detector 601 and to provide a terminal count pulse to integrator 612 when pulse accumulator 651 receives a particular number of early pulses. Similarly, late pulse accumulator 652 is configured to accumulate late pulses from phase detector 601 and to provide a terminal count pulse to integrator 612 when pulse accumulator 651 has received a particular number of early pulses. The terminal count may be, for example, after 16 pulses have been received, but other terminal count values may also be used in the present invention.

Integrator 612 is configured to operate at a lower frequency than the data frequency. For example, a divide by 10 clock divider device 611 reduces the operating frequency of integrator 612 by one tenth the high speed clock rate. Furthermore, other integrator 612 operating frequencies may be selected as appropriate, so long as the integrator operating frequency is at least as high as the frequency of pulse accumulator (e.g., 651, and 652) output. In the present example, with a divide by 16 pulse accumulator, the integrator operating frequency clock divider 611 must not be greater than the operating frequency of a divide by 16 device.

Figure 7:
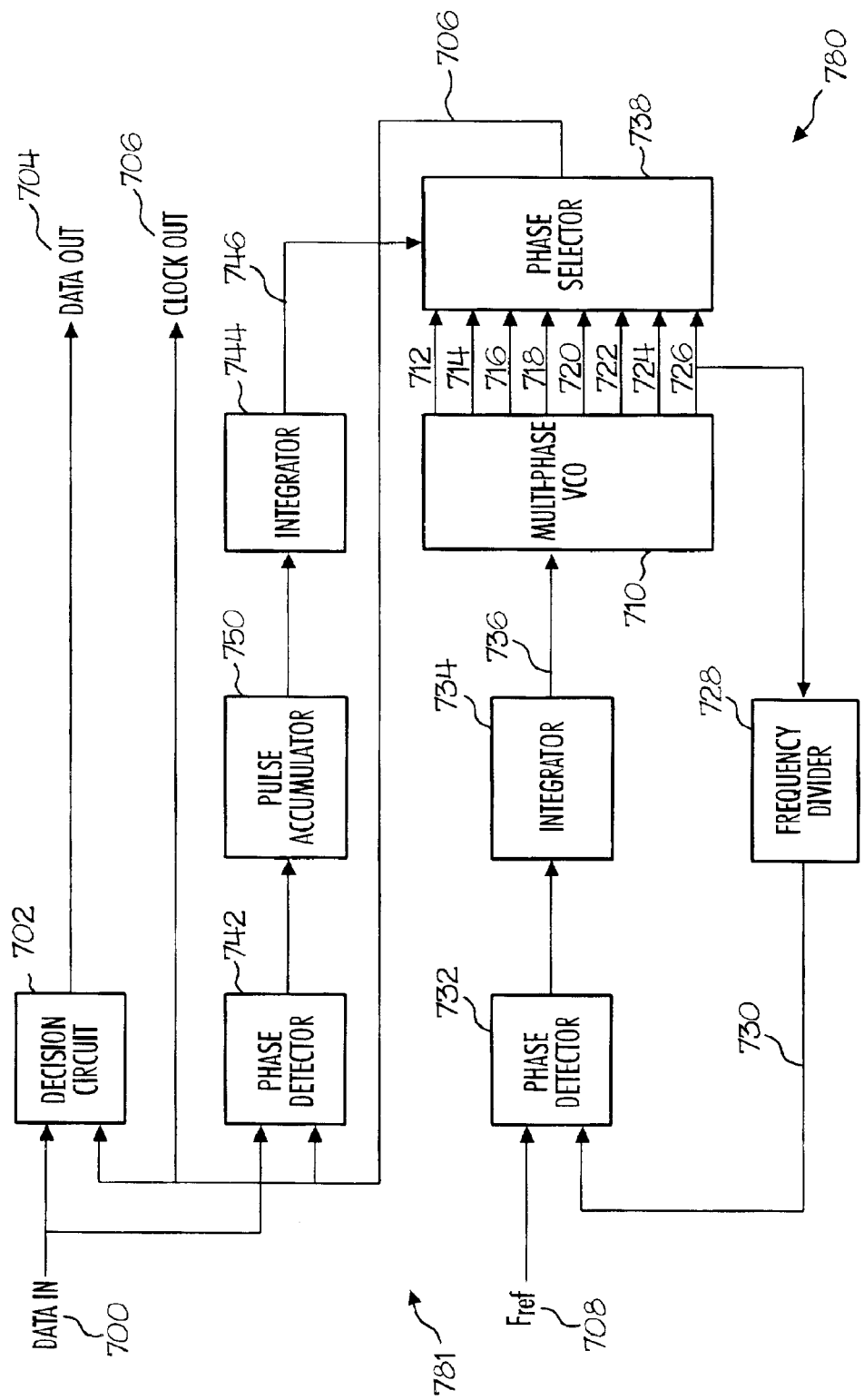
FIG. 7 is a block diagram of an exemplary DLL based clock and data recovery system in accordance with an exemplary embodiment of the present invention.

In another exemplary embodiment, and with reference to FIG. 7, a DLL clock and data recovery circuit includes a pulse accumulator 750. Note that this embodiment comprises both a phase locked loop 780 for generating a periodic input to phase selector 738 of delay locked loop 781, and a delay locked loop 781 that phase locks the periodic input to a data input 700.

During normal operation, data input 700 is provided to phase detector 742 which provides early and late pulses to pulse accumulator 750. Pulse accumulator 750 provides scaled early and late pulse counts to integrator 744 permitting the integrator to operate at a reduced frequency without loss of data. Integrator 744 provides an integrator output signal 746 to phase selector 738. Integrator output signal 746 is a control "word" causing phase selector 738 to select an output phase, for use as a clock signal 706, from among several output phases generated by VCO 710.

The clock signal 706 is generated using a phase locked loop 780 to multiply a reference clock 708. Reference clock 708 is close to the target data rate divided by a fixed number. VCO 710 generates multiple signals that are phase shifted from each other. In an exemplary embodiment, an eight phase VCO generates eight signals that are shifted 45 degrees from each other to create 8 identical signals that are evenly phase shifted from one to the next over 360 degrees. In other embodiments, more or less signals may be generated by VCO 710 that are shifted more or less than 45 degrees. Furthermore, the phase shifts may be non-uniform in other embodiments.

VCO output 726 is used to drive a frequency divider 728, which generates an output 730 which is at the VCO frequency divided by a fixed number. The divider output 730 and the reference input 708 are compared in a phase detector 732. The output of phase detector 732 is proportional to the difference between the phases and is provided to integrator 734. A VCO control signal 736 is generated by integrator 734 to drive VCO 710. The VCO control signal 736 tunes outputs 712, 714, 716, 718, 720, 722, 724, and 726 of VCO 710 such that the reference input 708 and frequency divider output 730 are phase locked, and the VCO outputs (e.g., 712, 714, 716, 718, 720, 722, 724, and 726) are at a multiple of the reference frequency 708.

The phase selector control signal 746 from integrator 744 is used in phase selector 738 to select one of the phases provided by VCO 710 to generate a clock signal 706 that is synchronized to the incoming data 700. In this manner, phase selector 738 effectively implements a variable delay or phase shift of the VCO outputs (e.g., 712, 714, 716, 718, 720, 722, 724, and 726). The phase selector output 706 is used to clock a decision circuit 702 and a phase detector 742. Again, the phase detector 742 drives integrator 744, through pulse accumulator 750, whose output 746 is used to drive selection of the phase in phase selector 738. In this manner, the output clock signal 706 of the phase selector 738 is phase locked to data input 700, providing appropriate timing for the decision circuit 702 and resulting in improved timing for generating the reclocked data output 704.

Figure 8:
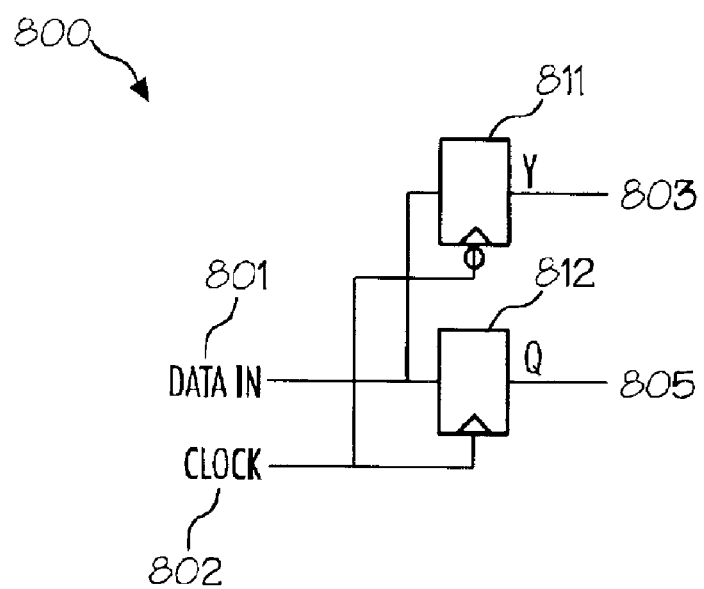
FIG. 8 is a block diagram of an exemplary phase detector in accordance with an exemplary embodiment of the present invention.

The use of a pulse accumulator enables the use of a simple phase detector. With reference to FIG. 8, phase detector 800 receives an input data signal 801 which is provided to the inputs of flip flops 811 and 812. A clock signal 802 is provided to flip flop 811 and 812. In accordance with an exemplary embodiment of the present invention, flip flop 811 is a negative edge triggered flip flop. Therefore, the output 805 of flip flop 812, designated Q, holds the value that was on "data in" 801 when the clock changed from a logic low to a logic high signal. In contrast, the output 803 of flip flop 811, designated Y, holds the value that was on "data in" 801 when the clock changes from a logic high to a logic low signal. In this exemplary embodiment, early pulses and late pulses from phase detector 800 are provided to the pulse accumulator on outputs 803 and 805 respectively.

Figure 9:
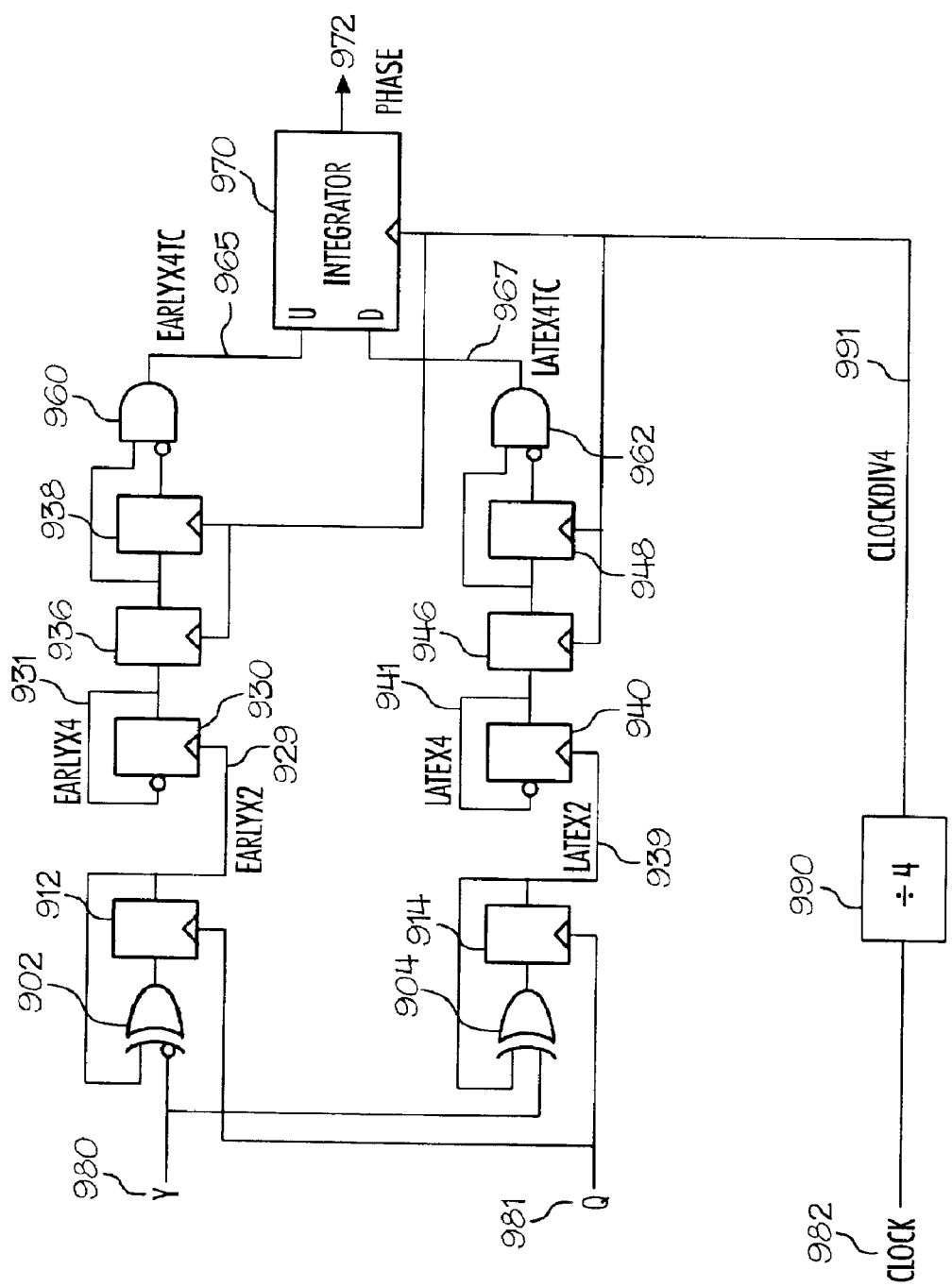
FIG. 9 is a block diagram of an exemplary pulse accumulator implementation using the rising transitions of data only in accordance with an exemplary embodiment of the present invention.

In a further exemplary embodiment, pulses are accumulated using a ripple divider for only rising transitions in the data signal. With reference to FIG. 9, an exemplary embodiment of a simplified pulse accumulator comprises an exemplary ripple divider. The exemplary pulse accumulator comprises XOR gates, flip flops, and AND gates configured to form an accumulator for counting by 4's.

An XOR gate 902 receives an inverted signal from input 980, which, in this exemplary embodiment, is the Y output of the phase detector. XOR gate 904 receives a non-inverted signal from input 980. The operation of an XOR gate is well-known in the art, with the output of an XOR gate being logically high if one, and only one, of the inputs is logically high. If the inputs are either both logically low or both logically high, then the output is logically low.

The output of XOR gate 902 is coupled to flip-flop 912 and the output of XOR gate 904 is coupled to flip-flop 914. The output of flip-flop 912 is coupled to the input of XOR gate 902 and provides the clock signal to flip-flop 930. Similarly, the output of flip-flop 914 is coupled to the input of XOR gate 904 and provides the clock signal to flip-flop 940. The clock signals 929 and 939 respectively provide an EARLYX2 and LATEX2 clock signal to the respective flip-flops. Flip-flops 930 and 940 respectively provide an output, EARLYX4 931 and LATEX4 941, which are respectively coupled to their own inverted inputs and to flip-flops 936 and 946. The output of flip-flops 936 and 946 are respectively coupled to the inputs of flip-flop 938 and 948. In this exemplary embodiment, all flip-flop logic circuits are positive-edge triggered.

The output of flip-flops 936 and 938, are coupled to the inputs of AND gate 960. The output of flip-flops 946 and 948 are coupled to the inputs of AND gate 962. AND gates 960 and 962 provide a logically high output only if both inputs are logically high. However, as illustrated, both AND gates 960 and 962 contain one inverting input. The output of AND gates 960 and 962 are coupled to synchronous pulse counter (i.e., integrator) 970. More particularly, the output of AND gate 960 is coupled to the up input of pulse counter 970 and the output of AND gate 962 is coupled to the down input of pulse counter 970. In this exemplary embodiment, output 972 of pulse counter 970 is coupled to a voltage controlled oscillator ("VCO") to control the frequency of the VCO.

In this exemplary embodiment, the integrator is configured to operate at ¼ the serial clock rate. This series of flip-flops serve to perform a frequency division of 4 on the output of XOR gates 902 and 904. Furthermore, this exemplary embodiment only counts early and late pulses on the rising data transitions. In this manner, the high frequency is reduced to a frequency that requires less power to process and results in a faster processing.

The pulse accumulator, in one exemplary embodiment, carries out pulse accumulation when, on each rising transition of the reclocked data Q 981, either flip-flop 902 or 904 toggles its output. The transition sample Y 980 indicates which flip-flop should be toggled. If Y is a logic low "0", the clock was early and the output of flip-flop 912, the signal named EarlyX2 929, is toggled. If Y is a logic 1, the clock was late, and therefore the output of flip-flop 914, the signal named LateX2 939, is toggled. The toggling function is accomplished through the use of XOR gates 902 and 904.

Similarly flip-flop 930 toggles its output EarlyX4 931 on rising edges of EarlyX2 929 and flip-flop 940 toggles its output LateX4 941 on rising edges of LateX2 939. In this manner, Early X4 toggles from 0 to 1 and back to 0 when 4 early decisions have been made and LateX4 toggles from 0 to 1 and back to 0 when 4 late decisions have been made. The rising transitions of EarlyX4 are detected using flip-flops 936, 938, and AND gate 960, and reclocked by a divide by 4 clock signal 991 which is generated from the recovered clock 982 and a divide by 4 circuit 990. The rising transitions of LateX4 are detected using flip-flops 946, 948, and AND gate 962, and reclocked by a divide by 4 clock 991. In this manner, for example, 936 holds the current value, 938 holds the previous value, and 960 provides a pulse for one complete scaled down reclocked clock cycle when a pulse is detected (the current and previous values do not agree).

The divide by 4 clock also drives an integrator 970, that increments and decrements based on the EarlyX4TC 965 and LateX4TC 967 inputs from the outputs of AND gates 960 and 962 respectively. Thus integrator 970 increments its count by 1 every 4 early decisions and decrements by 1 every 4 late decisions. The output of integrator 970 can drive the phase selector directly, or the LSBs of the integrator can be quantized and driven by the MSBs of the integrator. This change in scale has the effect of changing the gain and bandwidth of the clock and data recovery loop.

Figure 10:
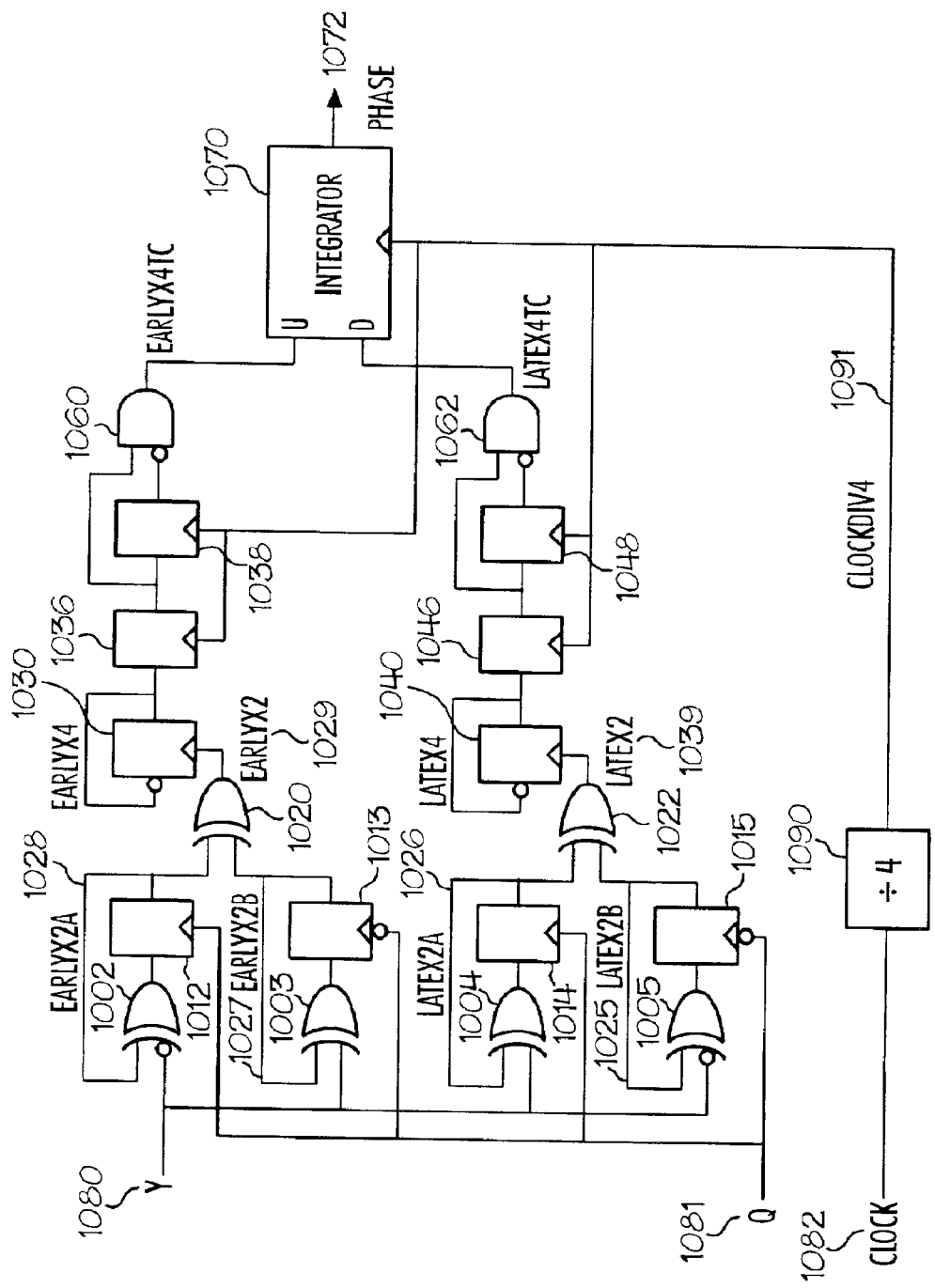
FIG. 10 is a block diagram of an exemplary pulse accumulator implementation using the rising and falling transitions of data in accordance with an exemplary embodiment of the present invention.

In another exemplary embodiment, pulses are accumulated using a ripple divider for both rising and falling transitions. In an exemplary embodiment, and with reference to FIG. 10, the pulse accumulator is changed to count early and late pulses on both rising and falling transitions of Q. In other words, early/late decisions are made on both the 0–1 transitions and the 1–0 transitions in the data signal.

Flip-flop 1012 and XOR 1002 serve the same function as flip-flop 912 and XOR 902 in FIG. 9, where the flip-flop output EarlyX2A 1028 toggles on every early decision made on a rising transition of Q, similar to flip-flop 912. Flip-flop 1013 and XOR 1003 are provided such that flip-flop output EarlyX2B 1027 toggles on every early decision made on a falling transition of Q. XOR 1020 then combines both output signals 1028 and 1027 such that XOR 1020 output EarlyX2 1029 toggles on every early decision made on either transition of Q.

A similar modification is made to the late transition pulse accumulator. Flip-flop 1014 and XOR 1004 serve the same function as flip-flop 914 and XOR 904 in FIG. 9, where the flip-flop output LateX2A 1026 toggles on every late decision made on a rising transition of Q, similar to flip-flop 914. Flip-flop 1015 and XOR 1005 are provided such that flip-flop output LateX2B 1025 toggles on every late decision made on a falling transition of Q. XOR 1022 then combines both 1026 and 1025 such that XOR 1022 output LateX2 1039 toggles on every late decision made on either transition of Q. The remaining circuits 1030, 1036, 1038, 1060, 1070, 1040, 1046, 1048, 1062, and 1090 have similar function as similar circuits described with reference to FIG. 9. Also, signals 1030 and 1040 serve similar functions as describe with reference to similar signals 930 and 940 in FIG. 9.

Figure 11:
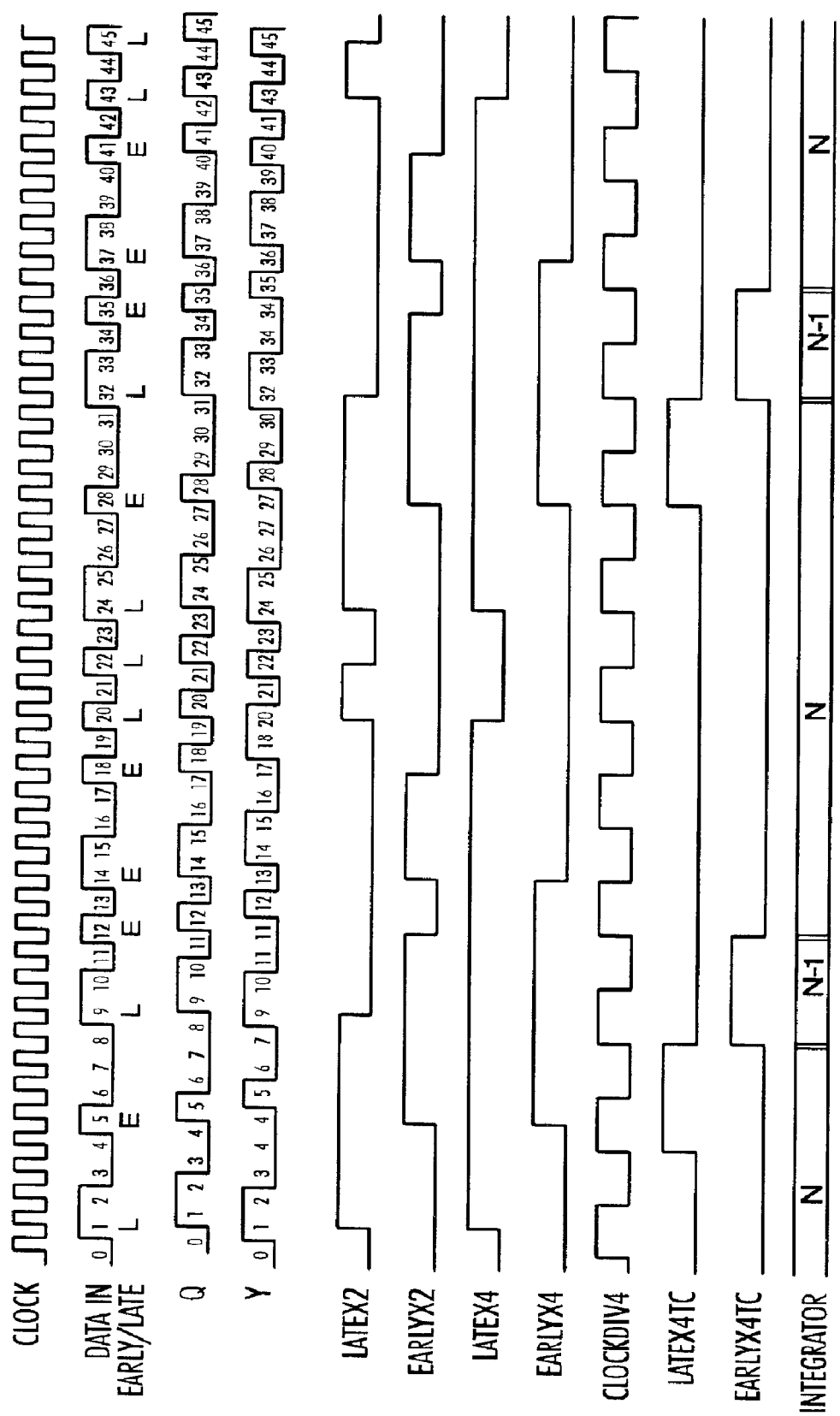
FIGS. 11 and 12 are exemplary timing diagrams for the exemplary pulse accumulators of FIGS. 9 and 10.
Figure 12:
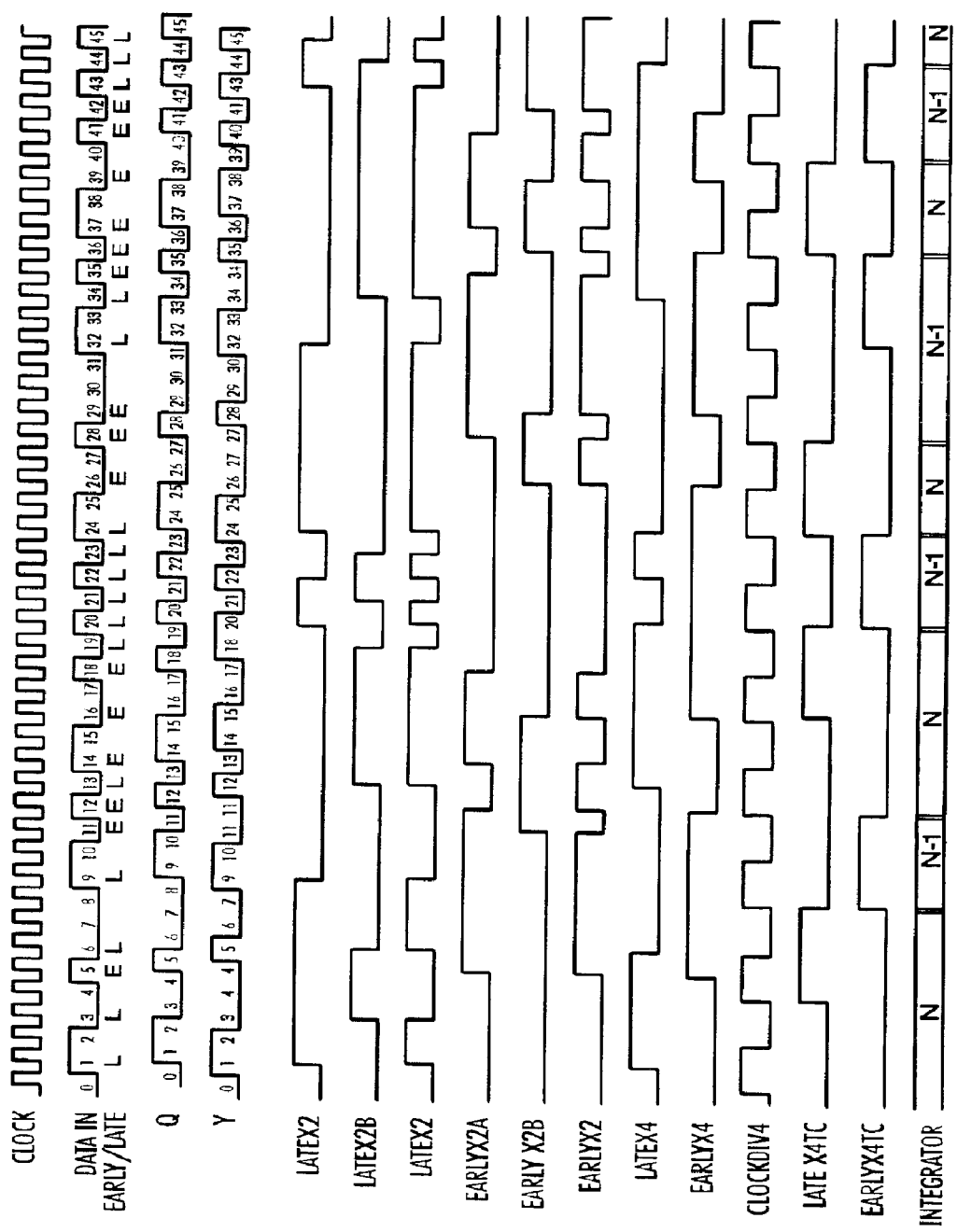

FIG. 11 is an exemplary timing diagram of a representative waveform for the exemplary circuit in FIG. 9. FIG. 12 is an exemplary timing diagram of a representative waveform for the exemplary circuit in FIG. 10.

Although the above described "simplified" pulse accumulators are described as divide by 4 pulse accumulators, in other exemplary embodiments, the pulse accumulators may be configured as divide by 16 pulse accumulators. In other exemplary embodiments, other divisors may be used to scale down the early/late pulse counts before they are provided to the integrator. The recovered clock signal is also scaled down and is such that the integrator operates at a lower clock frequency that is at least as great as the rate of terminal early and late counts being provided to the integrator.

Figure 13:
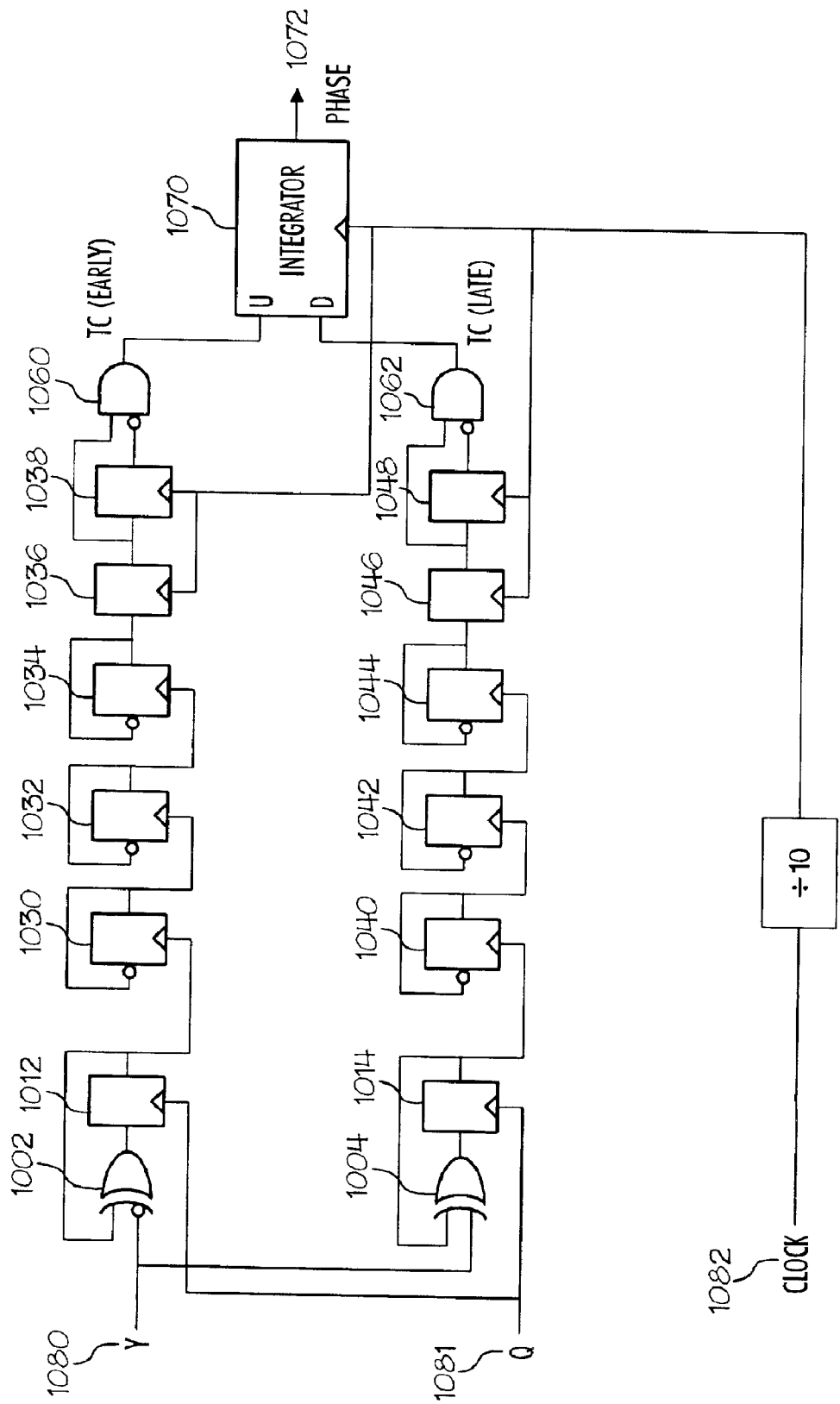
FIG. 13 is a block diagram of an exemplary pulse accumulator implementation using the rising transitions of data only in accordance with an exemplary embodiment of the present invention.

A divide by 16 pulse counter can be made from a divide by 4 pulse counter by adding flip-flops 1032, 1034, 1042, and 1044 as described with reference to FIGS. 13 and 14. FIG.'s 13 and 14 illustrate exemplary pulse accumulators/integrators in accordance with the present invention. Gates 1002, 1004, 1003, and 1005 are XOR gates. XOR gate 1002 and XOR gate 1005 each contain one normal input, one inverting input, and one output. XOR gates 1003 and 1004 each contain two normal inputs and one output. The inverting input of both XOR gate 1002 and XOR gate 1005 are coupled to input 1080, which is coupled to the output Y of a phase detector. One of the inputs of both XOR gate 1003 and XOR gate 1004 is also coupled to input 1080.

The output of each of XOR gate 1002, 1004, 1003, and 1005 is coupled to a D flip-flop. More particularly, the output of XOR gate 1002 is coupled to flip-flop 1012; the output of XOR gate 1004 is coupled to flip-flop 1014; the output of XOR gate 1006 is coupled to flip-flop 1016; and the output of XOR gate 1008 is coupled to flip-flop 1018. In this exemplary embodiment, both flip-flop 1012 and flip-flop 1014 are positive-edge triggered, while flip-flops 1013 and 1015 are both negative-edge triggered.

The outputs of flip-flop 1012 and flip-flop 1013 serve as the inputs to XOR gate 1020 as well as to XOR gates 1002 and 1003 respectively. The outputs of flip-flop 1014 and flip-flop 1015 serve as the inputs to XOR gate 1022 as well as to XOR gates 1004 and 1005 respectively. The output of XOR gate 1020 is coupled to flip-flops 1030, 1032, 1034, 1036, and 1038 which serve to perform a frequency division of 16 on the output of XOR gate 1020. In a similar manner, the output of XOR gate 1022 is coupled to flip-flops 1040, 1042, 1044, 1046, and 1048. In this manner, the high frequency is reduced to a frequency that requires less power to process and results in a faster processing.

Flip-flops 1030, 1032, 1034, 1040, 1042, and 1044 are each D flip-flops with an inverting input. Flip-flops 1036, 1038, 1046, and 1048 are each D flip-flops with inverting input. AND gates 1060 and 1062 are known in the art to provide a logically high output only if both inputs are logically high. It should be noted, however, that, as illustrated, both AND gates 1060 and 1062 contain one inverting input.

The output of AND gates 1060 and 1062 are coupled to synchronous pulse counter 1070. More particularly, the output of AND gate 1060 is coupled to the "up" input of pulse counter 1070 and the output of AND gate 1062 is coupled to the "down" input of pulse counter 1070. In this exemplary embodiment, output 1072 of pulse counter 1070 is coupled to a voltage controlled oscillator ("VCO") to control the frequency of the VCO.

In this exemplary embodiment, and similar to the embodiment discussed with reference to FIG. 9, early decisions are detected as a logic low level on the input Y 1080 during transitions on input Q 1081. Late decisions are detected as a logic high level on the input Y 1080 during transitions on input Q 1081. The output of flip-flop 1030 toggles from 0 to 1 and back to 0 after 4 early decisions have been made and the output of flip-flop 1040 toggles from 0 to 1 and back to 0 after 4 late decisions have been made. Flip-flops 1032 and 1034 are set us as a ripple divider such that the output of flip-flop 1034 toggles every 4 transitions of flip-flop 1030. Similarly, flip-flop 1044 toggles every 4 transitions of flip-flop 1040. In this manner, the output of flip-flop 1034 toggles from 0 to 1 and back to 0 after 16 early decisions have been made and the output of flip-flop 1044 toggles from 0 to 1 and back to 0 when 16 late decisions have been made.

Similarly, in one exemplary embodiment, the rising transitions on the output of flip-flop 1034 are detected and synchronized to the clock by flip-flops 1036 and 1038 and AND gate 1060, and the rising transitions on the output of flip-flop 1044 are detected and synchronized to the clock by flip-flops 1046 and 1048 and AND gate 1062. In this manner, the frequency of early and late data signals provided to the integrator is reduced and the high frequency operation of integrator 1070 is reduced to a lower frequency that requires less power to process and results in a faster processing.

Figure 14:
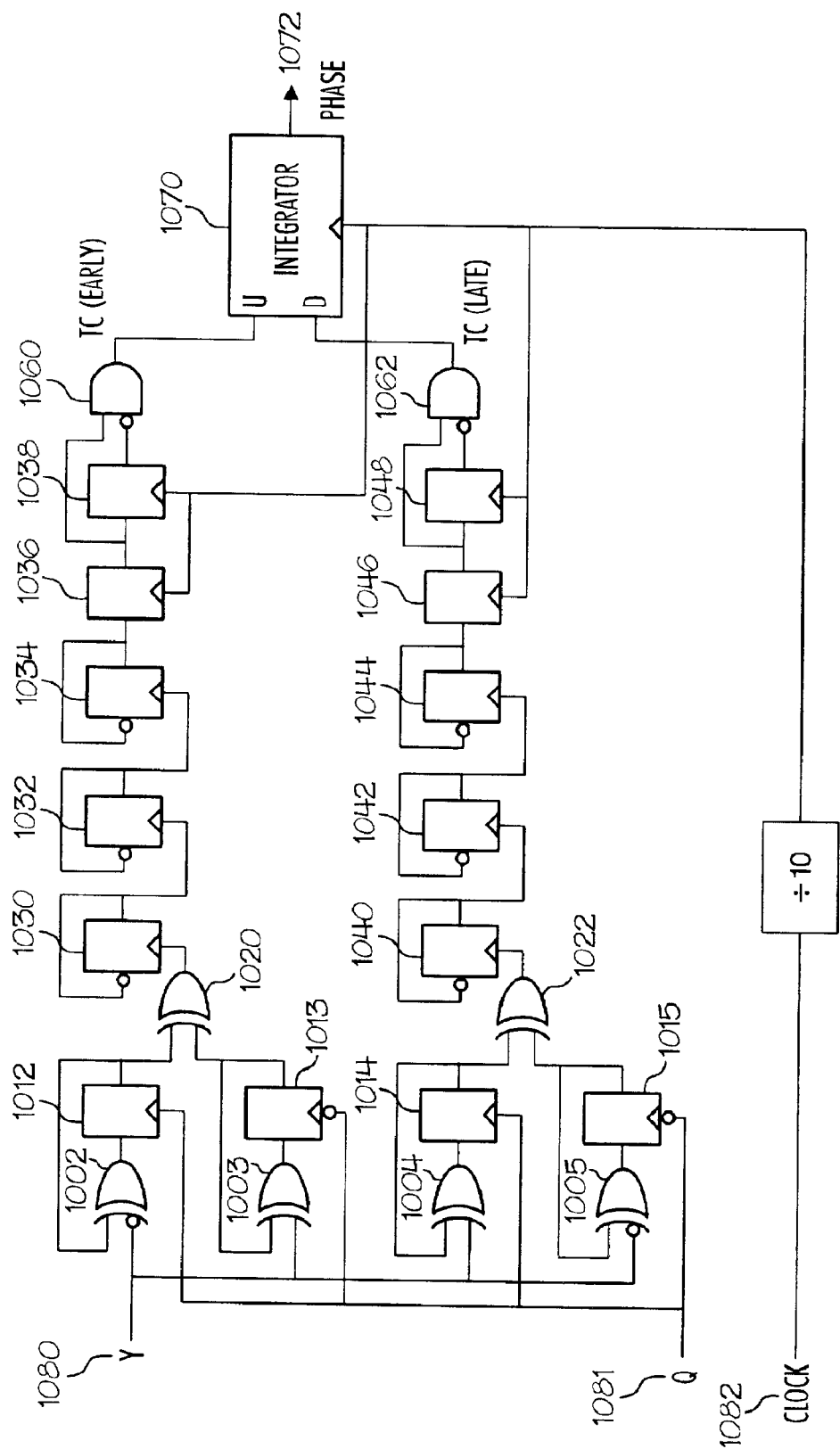
FIG. 14 is a block diagram of an exemplary pulse accumulator implementation using the rising and falling transitions of data in accordance with an exemplary embodiment of the present invention.

In another exemplary embodiment, with reference to FIG. 14, pulses are accumulated using a divide by 16 ripple divider for both rising and falling transitions. Similarly to the embodiment discussed with reference to FIG. 10, early decisions are detected as a logic low level on the input Y 1080 during rising transitions on input Q 1081 or a logic high level on the input Y 1080 during falling transitions on input Q 1081, and late decisions are detected as a logic high level on the input Y 1080 during rising transitions on input Q 1081 or as a logic low level on the input Y 1080 during falling transitions on input Q 1081.

Similar to the embodiment discussed with reference to FIG. 12, flip-flops 1030, 1032 and 1034, and flip-flops 1040, 1042, and 1044 are set us as a ripple dividers such that the output of flip-flop 1034 toggles from 0 to 1 and back to 0 after 16 early decisions are made and the output of flip-flop 1044 toggles from 0 to 1 and back to 0 after 16 late decisions are made.

Therefore, in accordance with various aspects of the present invention, a lower frequency integrator can be used without reducing the data transfer rate. Stated another way, the use of pulse accumulators with high frequency integrators enables obtaining even higher data transfer rates. Therefore the present invention may be used, for example, to provide faster download or exchange of data over the internet, in wireless communication, and in other data communication applications. Other exemplary applications include the tuning of a radio station and a clock multiplier. Although the pulse accumulator has been described in one exemplary embodiment as a ripple divider, other methods of lowering the clock rate of the early and late counts are also contemplated within the scope of the present invention. For example, a synchronous divider may be used instead of a ripple divider. Other suitable dividers or logic device arrangements may also be employed in the systems of the present invention.

Although the present invention is set forth herein in the context of the appended drawing figures, it should be appreciated that the invention is not so limited to the specific form shown. Various modifications, variations, and enhancements in the design and the arrangement of the method and apparatus set forth herein may be made without departing from the spirit and scope of the present invention. For example, the D flip-flops may be replaced with other forms of flip-flops or other circuitry that performs similar functions. Also, the various components may be implemented in alternate ways, such as varying or alternating the steps in different orders. These alternatives can be suitably selected depending upon the particular application or in consideration of any number of factors associated with the operation of the system. As a further example, the pulse accumulator may be used in other applications where digital integrators are used to count the number of high frequency events that are not necessarily binary in nature. These and other changes or modifications are intended to be included within the scope of the present invention.

What is claimed is:

1. An early-late pulse accumulator comprising:
   a first logic device configured to toggle a first output logic level upon receipt of an early pulse;
   a second logic device configured to toggle a second output logic level upon receipt of a late pulse, wherein the first and second logic devices are configured to allow only one of the first and second output logic levels to be toggled at a time;
   a first ripple divider configured to receive the first output logic level and to provide a scaled down count of the number of times the first logic device toggles;
   a second ripple divider configured to receive the second output logic level and to provide a scaled down count of the number of times the second logic device toggles;
   a first synchronizing logic device configured to receive the scaled down count of the number of times the first logic device toggles and to generate a first terminal count signal proportional to the number of early pulses received by the first logic device;
   a second synchronizing logic device configured to receive the scaled down count of the number of times the second logic device toggles and to generate a second terminal count signal proportional to the number of late pulses received by the second logic device; and
   an integrator configured to receive the first and second terminal count signals and generate a net early-late count.

2. The accumulator of claim 1 wherein the integrator is configured to increment upon receipt of the first terminal count signals and decrement upon receipt of late terminal count signals.

3. The accumulator of claim 1 wherein the first logic device comprises a first XOR gate configured to toggle a first flip-flop, and wherein the second logic device comprises a second XOR gate configured to toggle a second flip-flop.

4. The accumulator of claim 1 wherein the first logic device and the second logic device are configured to toggle as clocked by a transition in the data signal.

5. The accumulator of claim 4 wherein the transition in the data signal is a rising data signal.

6. The accumulator of claim 4 wherein the transition in the data signal is a falling data signal.

7. The accumulator of claim 4 wherein the transition in the data signal comprises an alternating rising data signal and falling data signal.

8. A pulse accumulator comprising:
   a logic device for receiving more than one early pulse and more than one late pulse;
   an early ripple divider configured to count the early pulses on a scaled down basis;
   a late ripple divider configured to count the late pulses on a scaled down basis;
   an early pulse synchronizing device configured to receive the scaled down early pulses and to generate an early terminal count corresponding to the number of early pulses;
   a late pulse synchronizing device configured to receive the scaled down late pulses and to generate a late terminal count corresponding to the number of late pulses;
   an integrator configured to receive a scaled down clock signal and to increment upon receipt of the early terminal count signals and decrement upon receipt of the late terminal count signals.

* * * * *